(12) United States Patent
Yen et al.

(10) Patent No.: US 9,429,620 B2
(45) Date of Patent: Aug. 30, 2016

(54) SIGNAL PROCESSING SYSTEM WITH BIST FUNCTION, TESTING METHOD THEREOF AND TESTING SIGNAL GENERATOR

(71) Applicant: MStar Semiconductor, Inc., Hsinchu Hsien (TW)

(72) Inventors: Shih-Chieh Yen, ChuPei (TW); Chih-Ming Hung, ChuPei (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 137 days.

(21) Appl. No.: 14/273,985

(22) Filed: May 9, 2014

(65) Prior Publication Data
US 2014/0365841 A1 Dec. 11, 2014

(30) Foreign Application Priority Data
Jun. 7, 2013 (TW) .............................. 102120298 A

(51) Int. Cl.
*H04B 17/00* (2015.01)
*G01R 31/317* (2006.01)
*G01R 31/28* (2006.01)

(52) U.S. Cl.
CPC ..... *G01R 31/31715* (2013.01); *G01R 31/2822* (2013.01); *H04B 17/0085* (2013.01)

(58) Field of Classification Search
CPC .............. H04B 17/00; H04B 17/0085; G01R 31/2822; G01R 31/31715
See application file for complete search history.

(56) References Cited

U.S. PATENT DOCUMENTS

| | | | |
|---|---|---|---|
| 6,449,307 B1* | 9/2002 | Ishikawa ................ | G01R 27/28 370/241 |
| 6,498,929 B1* | 12/2002 | Tsurumi ................ | H03D 3/008 327/307 |
| 9,136,899 B2* | 9/2015 | Chakraborty ............ | H04B 1/40 |
| 2004/0148580 A1* | 7/2004 | de Obaldia ............ | H04B 17/29 714/715 |
| 2005/0107059 A1* | 5/2005 | Lehning .................. | H04L 27/00 455/303 |
| 2006/0026476 A1* | 2/2006 | Nishida ............ | G01R 31/31858 714/730 |
| 2007/0060069 A1* | 3/2007 | Kerth ................. | H04B 17/0085 455/67.14 |
| 2008/0103719 A1* | 5/2008 | Seong ............ | G01R 31/318552 702/125 |
| 2010/0177811 A1* | 7/2010 | Duerdodt ................. | H04B 1/40 375/224 |
| 2012/0126821 A1* | 5/2012 | Forstner ............. | G01R 31/2822 324/537 |
| 2013/0107918 A1* | 5/2013 | Tomisawa ................ | H04B 1/40 375/219 |
| 2014/0355655 A1* | 12/2014 | Chakraborty ............ | H04B 1/40 375/219 |

* cited by examiner

*Primary Examiner* — Steve Nguyen
(74) *Attorney, Agent, or Firm* — Edell, Shapiro & Finnan, LLC

(57) ABSTRACT

A signal processing system includes a module under test, an oscillation signal generator, a translational filter, and a testing module. The module under test has a signal input end. The oscillation signal generator generates an oscillation signal. The translational filter includes a mixer controlled by the oscillation signals. The mixer has a high-frequency side and a low-frequency side. The high-frequency side is coupled to the signal input end of the module under test. The testing module is coupled to the low-frequency side of the mixer. When the signal processing system is in a testing mode, the testing module provides a testing signal to the low-frequency side, so as to generate a high-frequency testing signal at the high-frequency side of the mixer.

19 Claims, 8 Drawing Sheets

SIGNAL PROCESSING SYSTEM WITH BIST FUNCTION, TESTING METHOD THEREOF AND TESTING SIGNAL GENERATOR

This application claims the benefit of Taiwan application Serial No. 102120298, filed Jun. 7, 2013, the subject matter of which is incorporated herein by reference.

BACKGROUND OF THE INVENTION

1. Field of the Invention

The invention relates in general to a testing technology for a computer system, and more particularly, to a signal processing system with a built-in self-test (BIST) function.

2. Description of the Related Art

Ensuring normal functionality of products when the products are shipped out of the factory is always a focus of manufacturers. By pre-filtering out and repairing problematic products, post-sales returns and exchanges can be effectively prevented to increase customer satisfaction.

For an electronic system, a most common test item is inputting a simulation signal at an input end of a circuit and monitoring whether a processed result outputted at a rear-end is correspondingly a correct output signal. Taking a communication system 100 simultaneously including a transmitting circuit 12 and a receiving circuit 14 in FIG. 1 for example, a current testing method is establishing a loopback path 16 between the transmitting circuit 12 and the receiving circuit 14. In a normal mode, the loopback path 16 is set as open circuit, so that the transmitting circuit 12 and the receiving circuit 14 operate independently. In a testing mode, the loopback path 16 is set as close circuit, such that the signal processing module 18 controls the transmitting circuit 12 to provide a testing signal 13 via the loopback path 16 to the receiving circuit 14. According to a response signal 15 outputted by the receiving circuit 14, the signal processing module 18 determines whether the transmitting circuit 12 and the receiving circuit 14 are functional.

An advantage of the architecture shown in FIG. 1 is that no additional signal source for providing the testing signal is involved, and thus costs of testing apparatuses can be reduced. However, the testing architecture in FIG. 1 is unsuitable for applications of several signal processing systems below: 1) a signal processing system in which a dynamic output range of a transmitting circuit is different from that of a receiving circuit; 2) a signal processing system that does not allow simultaneous operations of a transmitting circuit and a receiving circuit; 3) a signal processing system in which a coupling path between a transmitting circuit and a receiving circuit is strictly prohibited; and 4) a signal processing system that includes only a receiving circuit but not a transmitting circuit.

For the above situations, a simulation input signal usually needs to be externally provided from a testing machine to test whether a receiving circuit is normal. However, signal frequencies to be processed by front-end circuits in many signal processing systems (e.g., a wireless communication apparatus) are quite high. As costs of testing apparatuses that can generate high-frequency testing signals are very high, overall testing costs are inevitably increased by considerable amounts.

SUMMARY OF THE INVENTION

The invention is directed to a signal processing system with a built-in self-test (BIST) function and a testing method thereof. With a translational filter that generates a testing signal in a chip, overall testing costs can be significantly lowered. Further, in additional to a transmitting circuit included in a same signal processing system, the testing method of the present invention is also applicable to a signal processing system that does not include a transmitting circuit.

According to an embodiment of the present invention, a signal processing system is provided. The signal processing system includes a module under test, an oscillation signal generator, a translational filter and a testing module. The module under test has a signal input end. The oscillation signal generator generates an oscillation signal. The translational filter includes a mixer controlled by the oscillation signal. The mixer has a high-frequency side and a low-frequency side. The high-frequency side is coupled to the signal input end of the module under test. The testing module provides a testing signal to the low-frequency side, so as to generate a high-frequency testing signal at the high-frequency side of the mixer.

According to another embodiment of the present invention, a testing method that generates a high-frequency testing signal by a translational filter is provided. The translational filter includes a mixer, which has a high-frequency side and a low-frequency side. In a testing mode, a testing signal is provided to the low-frequency side, so as to generate a high-frequency testing signal at the high-frequency side of the mixer. Next, the high-frequency testing signal is provided to a signal input end of a module under test. In a normal operation mode relative to the testing mode, the translational filter provides the module under test with a filtering function.

According to yet another embodiment of the present invention, a testing signal generator is provided. The testing signal generator, providing a high-frequency testing signal to a signal input end of a module under test, includes an oscillation signal generator, a translational filter and a testing module. The oscillation signal generator generates an oscillation signal. The translational filter includes a mixer controlled by the oscillation signal. The mixer has a high-frequency side and a low-frequency side. The high-frequency side is coupled to the signal input end of the module under test. The testing module provides a testing signal to the low-frequency side, so as to generate the high-frequency testing signal at the high-frequency side of the mixer.

The above and other aspects of the invention will become better understood with regard to the following detailed description of the preferred but non-limiting embodiments. The following description is made with reference to the accompanying drawings.

DETAILED DESCRIPTION OF THE INVENTION

Figure 2:
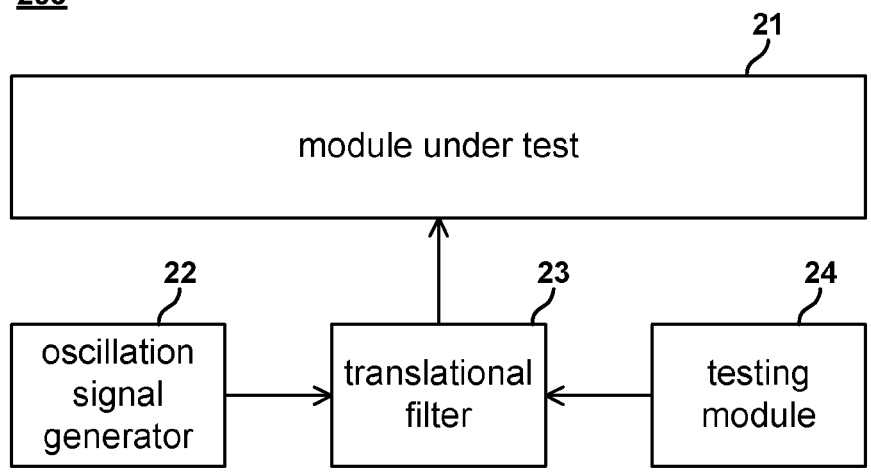
FIG. 2 is a functional block diagram of a signal processing system according to an embodiment of the present invention.

FIG. 2 shows a functional block diagram of a signal processing system with a built-in self-test (GIST) function according to an embodiment of the present invention. As shown in FIG. 2, a signal processing system 200 includes a module under test 21, an oscillation signal generator 22, a translational filter 23, and a testing module 24. In practice, the signal processing system 200 may be integrated in various electronic devices, e.g., desktop computers, laptop computers, smart phones and LAN access points, or may be an independent device. Further, in practice, the module under test 21 may be a signal receiving circuit.

Figure 3A:
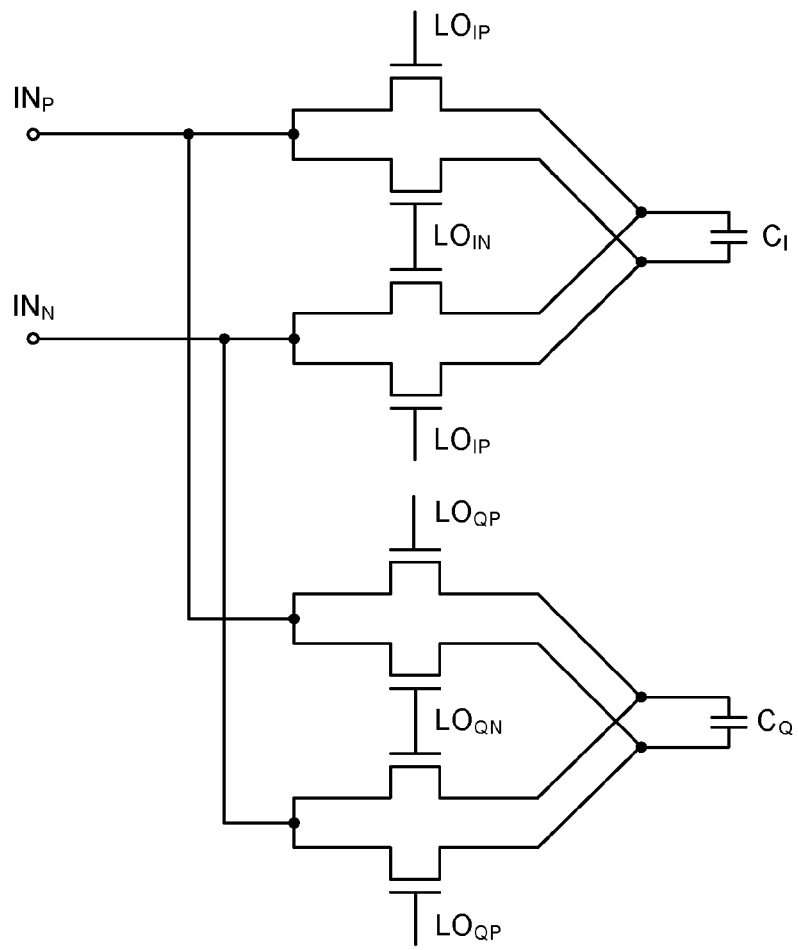
FIG. 3(A) is a detailed example of a translational filter.
Figure 3B:
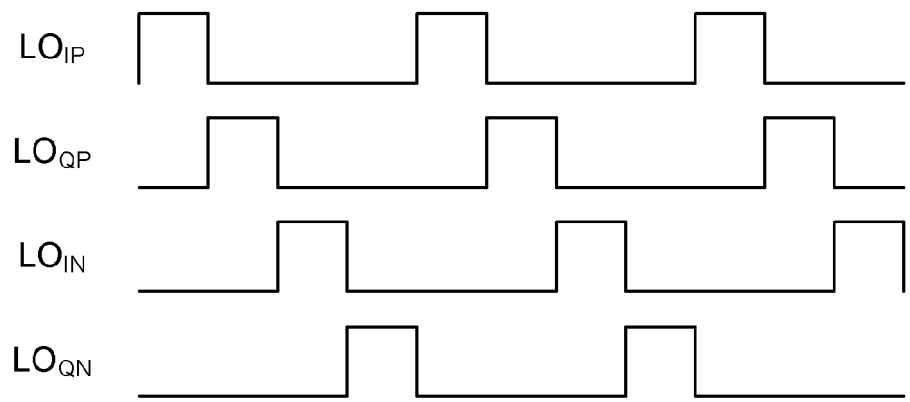
FIG. 3(B) is a exemplary timing diagram of local oscillation signals utilized by a translational filter.

FIG. 3(A) shows a detailed example of a translational filter according to an embodiment of the present invention. In this example, the translational filter includes a mixer formed by eight metal-oxide semiconductor field-effect transistors (MOSFETs), and capacitor elements $C_I$ and $C_Q$. The mixer is controlled by local oscillation signals $LO_{IP}$, $LO_{IN}$, $LO_{QP}$ and $LO_{QN}$. The four local oscillation signals have the same frequency but different phases. FIG. 3(B) shows an exemplary timing diagram of the local oscillation signals. Known to a one skilled person in the art, the capacitor elements $C_I$ and $C_Q$ located at a low-frequency side of the mixer are low-pass filters. Through effects of the mixer, the low-pass frequency resonance is translated to a bandpass frequency resonance. More specifically, for signals carried at a high-frequency side (differential input ends $IN_P$ and $IN_N$) of the mixer, the translational filter is in overall equivalent to a bandpass filter, whose central frequency is the frequencies of the local oscillation signals $LO_{IP}$, $LO_{IN}$, $LO_{QP}$ and $LO_{QN}$. Thus, by adjusting the frequencies of the local oscillation signals, the central frequency of the bandpass filter can be changed. Featuring a high quality factor and a central frequency that can be accurately controlled, translational filters are extensively applied in wireless communication systems and are utilized to filter and obtaining signals within a predetermined target frequency band for front-end receiving circuits.

Figure 4:
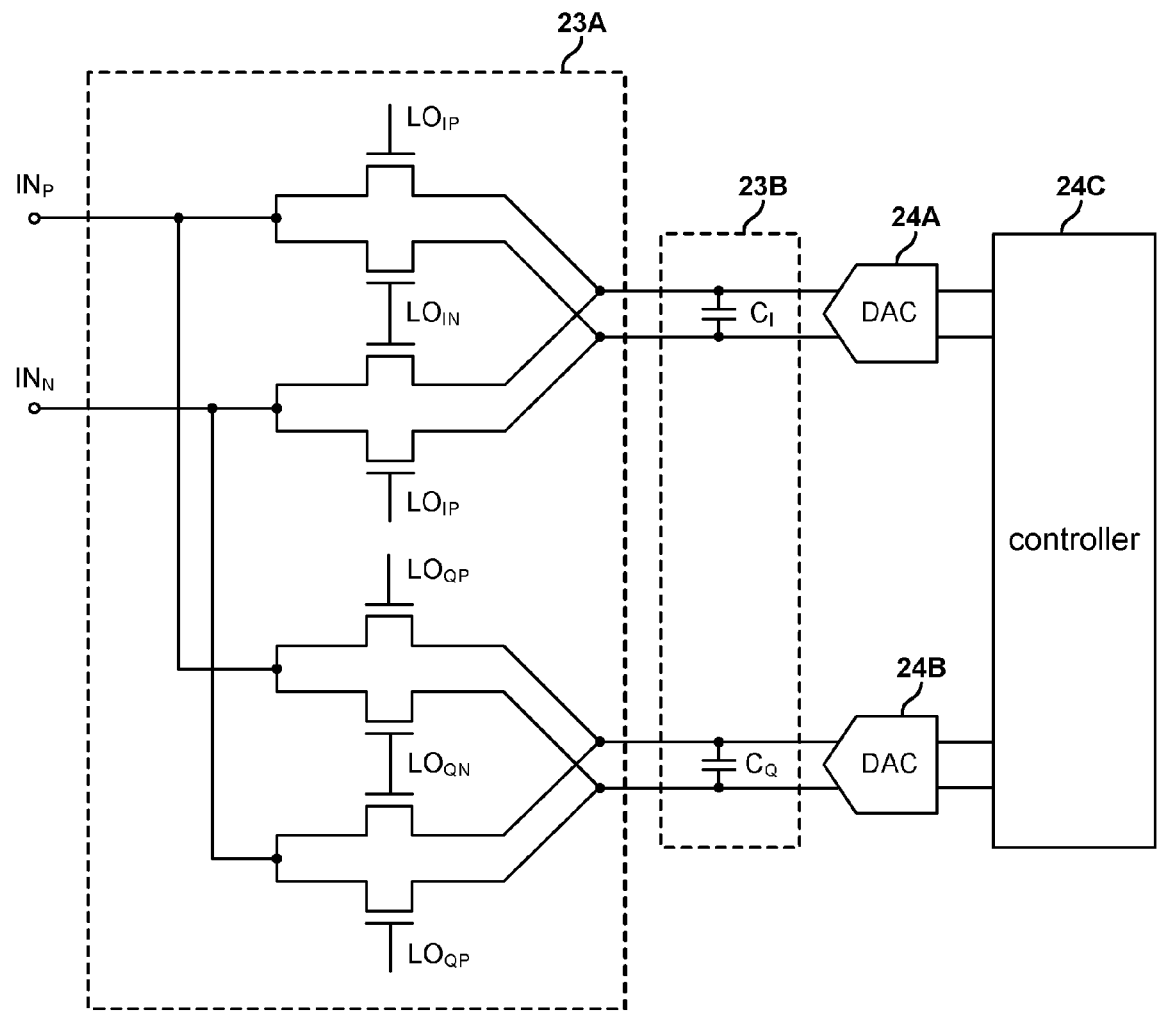
FIG. 4 are detailed examples of a translational filter and a testing module according to an embodiment of the present invention.

FIG. 4 shows a detailed example of the translational filter 23 and the testing module 24 according to an embodiment of the present invention. In the example, the translational filter 23 includes a mixer 23A, and a baseband filtering circuit 23B coupled to the low-frequency side of the mixer 23A; the testing module 24 includes digital-to-analog converters (DACs) 24A and 24B and a controller 24C. The oscillation signals $LO_{IP}$, $LO_{IN}$, $LO_{QP}$ and $LO_{QN}$ for controlling the mixer 23A may be provided by the oscillation signal generator 22. When the signal processing system 200 is in a testing mode, the controller 24C provides a set of digital testing signal for the DACs 24A and 24B to correspondingly generate a set of analog testing signals. As shown in FIG. 4, the DACs 24A and 24B are coupled to the low-frequency side of the mixer 23A. Based on characteristics of the mixer 23A, when the DACs 24A and 24B provide low-frequency analog signals at the low-frequency side of the mixer 23A, corresponding high-frequency analog signals are generated at the high-frequency side of the mixer 23A. The process is in equivalence up-converting the set of low-frequency analog signals according to the frequencies of the oscillation signals $LO_{IP}$, $LO_{IN}$, $LO_{QP}$ and $LO_{QN}$.

Figure 5:
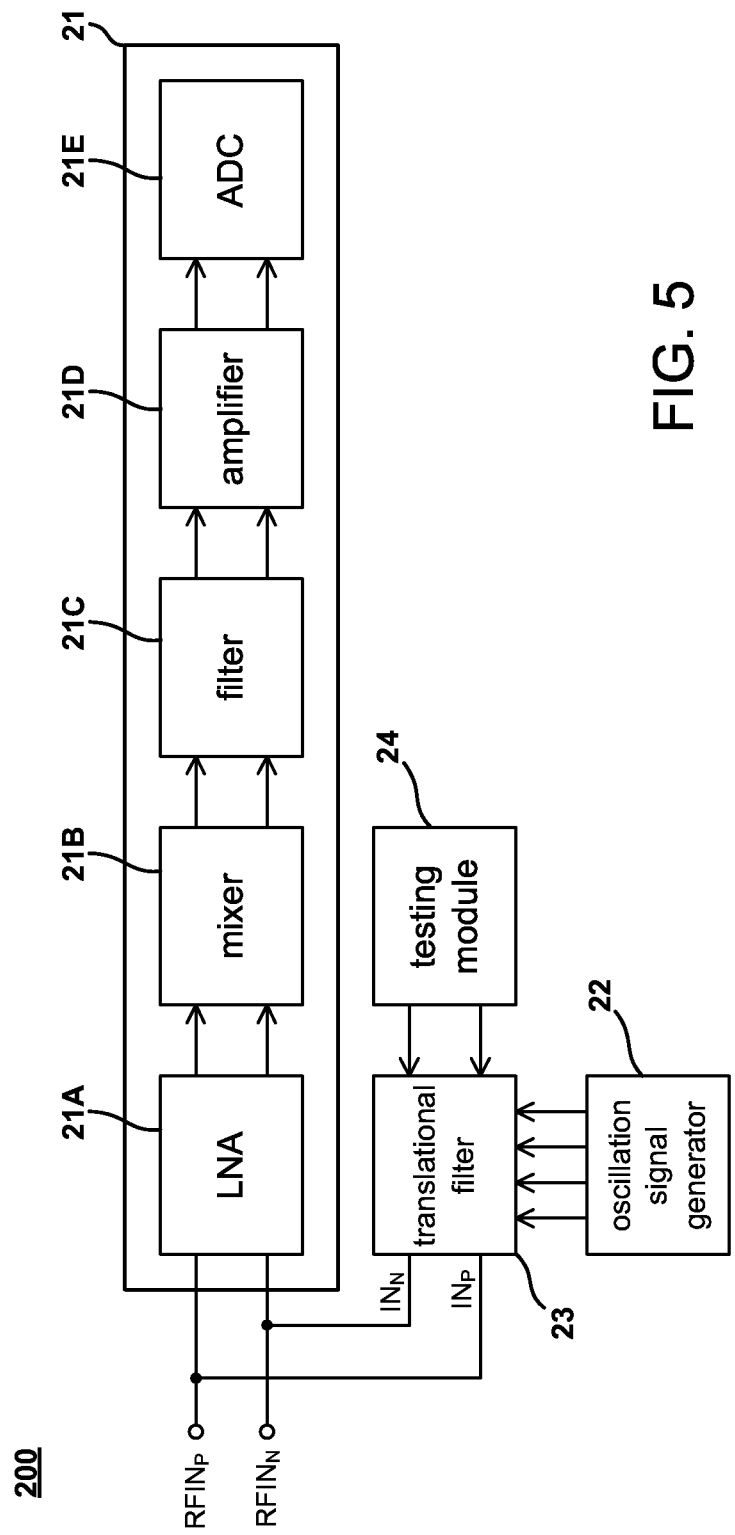
FIG. 5 is a detailed example of a signal processing system according to an embodiment of the present invention.

FIG. 5 shows a detailed example of the signal processing system 200 according to an embodiment of the present invention. In the example, the module under test 21 is a signal receiving circuit, has a set of differential signal input ends $RFIN_P$ and $RFIN_N$, and includes a low-noise amplifier (LNA) 21A, a mixer 21B, a filter 21C, an amplifier 21A, and an analog-to-digital converter (ADC) 21E. As shown in FIG. 5, nodes $IN_P$ and $IN_N$ at a high-frequency side of the mixer 23A are respectively coupled to the input ends $RFIN_P$ and $RFIN_N$ of the LNA 21A. In different modes, the translational filter 23 plays different roles. When the signal processing system 200 is in a normal operation mode, the translational filter 23 provides a bandpass filtering function with the LNA 21A to assist in filtering signals within a specific target frequency band. In contrast, when the signal processing system 200 is in a testing mode, the translational filter 23 is utilized to up-convert a testing signal generated by the testing module 24 and to thus provide the high-frequency testing signal to the input ends $RFIN_P$ and $RFIN_N$ of the LNA 21A. That is to say, when the signal processing system 200 is in the testing mode, the oscillation signal generator 22, the translational filter 23, and the testing module 24 may be regarded as a testing signal generator that generates a high-frequency testing signal to a signal input end of a module under test.

The frequency and contents of the testing signal generated by the testing module 24 may be determined according to actual requirements, and are not limited to specific patterns. For example, the set of testing signals may also be DC signals. It should be noted that, circuits in the testing module 24 may be adjusted according to desired testing signals, and need not necessarily include the foregoing DACs. Further, in practice, the oscillation signal generator 22 may be designed in a way that the oscillation signals $LO_{IP}$, $LO_{IN}$, $LO_{QP}$ and $LO_{QN}$ are adjustable. Thus, the frequency of the testing signal provided to the module under test 21 is also adjustable.

In one embodiment, the oscillation signal generator 22 is an inherent element in the module under test 21 instead of being independently located outside the module under test 21. For example, when the module under test 21 is a receiving circuit, the oscillation signal generator 22 may be a local oscillation signal generator in the module under test 21. Such approach helps in reducing overall costs of the signal processing system 200. Although in the above situation, the oscillation signal generator 22 may not be adjustable, the frequency of the high-frequency testing signal provided by the translational filter 23 may still be adjustable through adjusting the frequency of the testing signal generated by the testing module 24.

Figure 1:
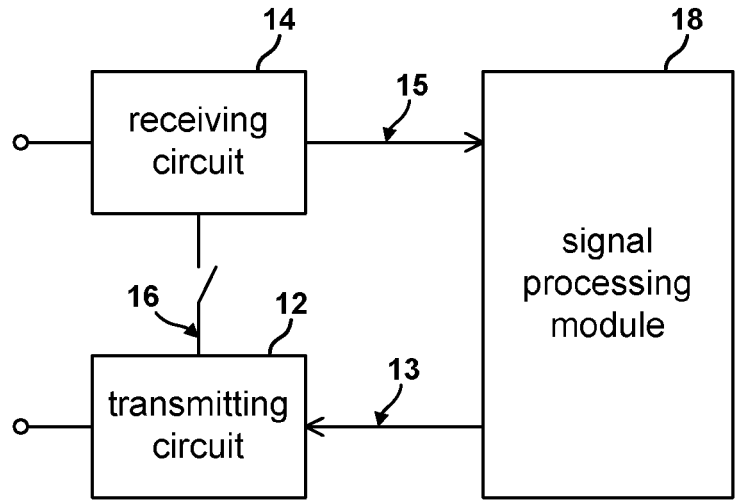
FIG. 1 is a functional block diagram of a communication system that includes a transmitting circuit, a receiving circuit, and a loopback path for testing purposes.

It should be noted that, as the oscillation signal generator 22 and the translational filter 23 are elements originally required in the signal processing system 200, overall costs for realizing the concept of the present invention may be far lower than those of an external testing machine capable of providing high-frequency signals. Further, different from the testing architecture shown in FIG. 1, the concept of the present invention may be applied to various types of signal processing systems. For example, the concept of the present invention is not limited to the application of a transmitting circuit in a same signal processing system, and may be further applied to a signal processing system that does not include a transmitting circuit.

In an alternative embodiment, the connection between the translational filter 23 and the module under test 21 may be different from that shown in FIG. 5 to perform different tests. For example, the nodes $IN_P$ and $IN_N$ at the high-frequency side of the mixer 23A may be respectively coupled to two output ends of the LNA 21A. Alternatively, the nodes $IN_P$ and $IN_N$ at the high-frequency side of the mixer 23A may be respectively coupled to two output ends of the amplifier 21D.

In one embodiment, when the signal processing system 200 is in the testing mode, the connection between the baseband filtering circuit 23B and the low-frequency side of the mixer 23A is disconnected. In other words, in the testing mode, the capacitor elements $C_I$ and $C_Q$ may be selectively separated from the connection path between the mixer 23A and the testing module 24, so as to prevent from affecting the testing signal transmitted from the testing module 24 to the mixer 23A.

Figure 6A:
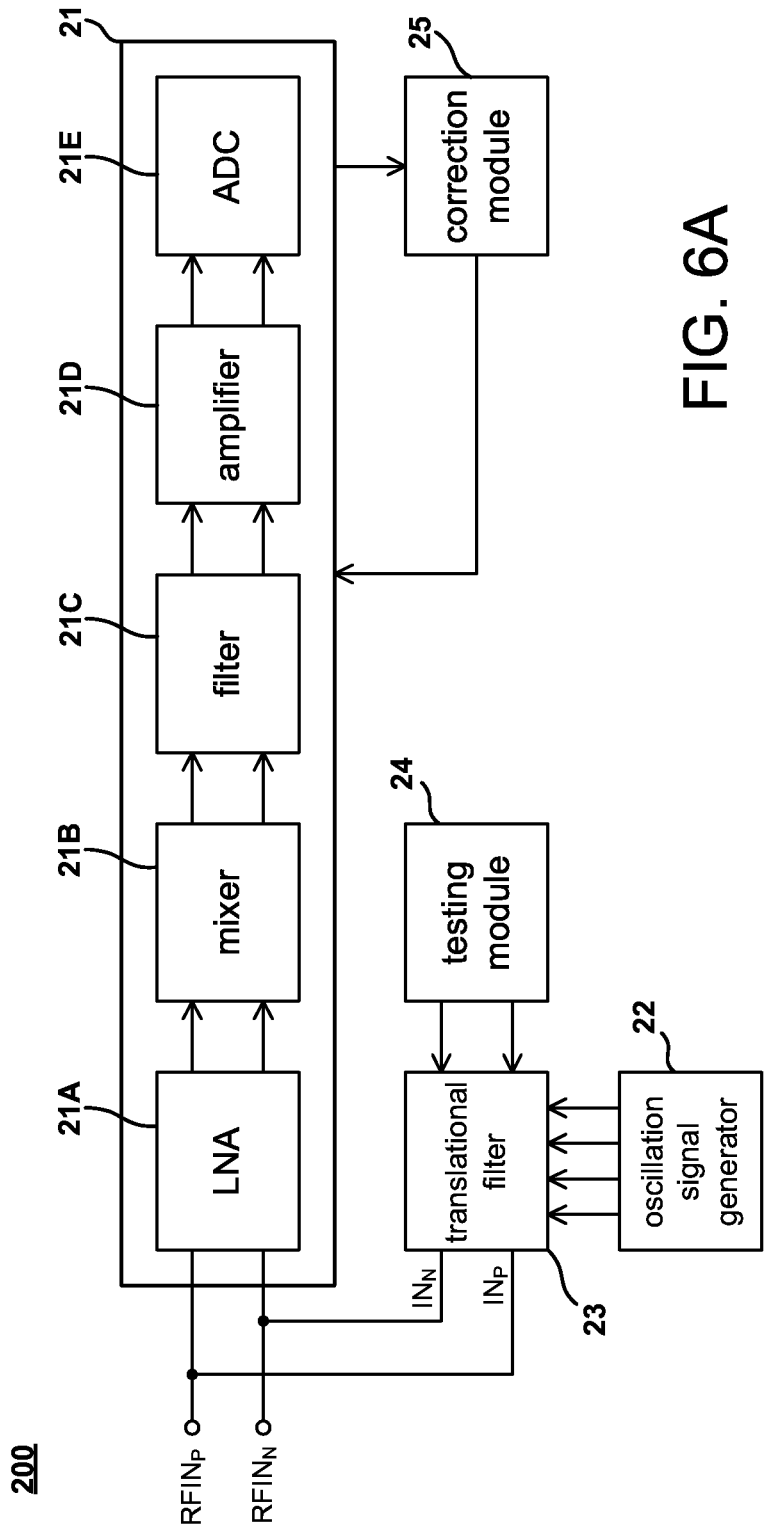
FIG. 6(A) and FIG. 6(B) are two examples of a signal processing system further including a correction module according to alternative embodiments of the present invention.

In one embodiment, as shown in FIG. 6(A), the signal processing system 200 further includes a correction module 24. According to the testing result (e.g., an output signal from the ADC 21E) that the module under test 21 generates in response to the set of high-frequency testing signals provided from the translational filter 23, the correction module 25 determines a correction setting for the module under test 21. Thus, non-ideal factors (e.g., mismatch between elements) in the module under test 21 may be counteracted, such that the output result from the module under test 21 more closely approaches an ideal value. Taking the architecture shown in FIG. 6(A) for example, the above correction setting may be utilized to adjust a DC offset in the ADC 21E.

Figure 6B:
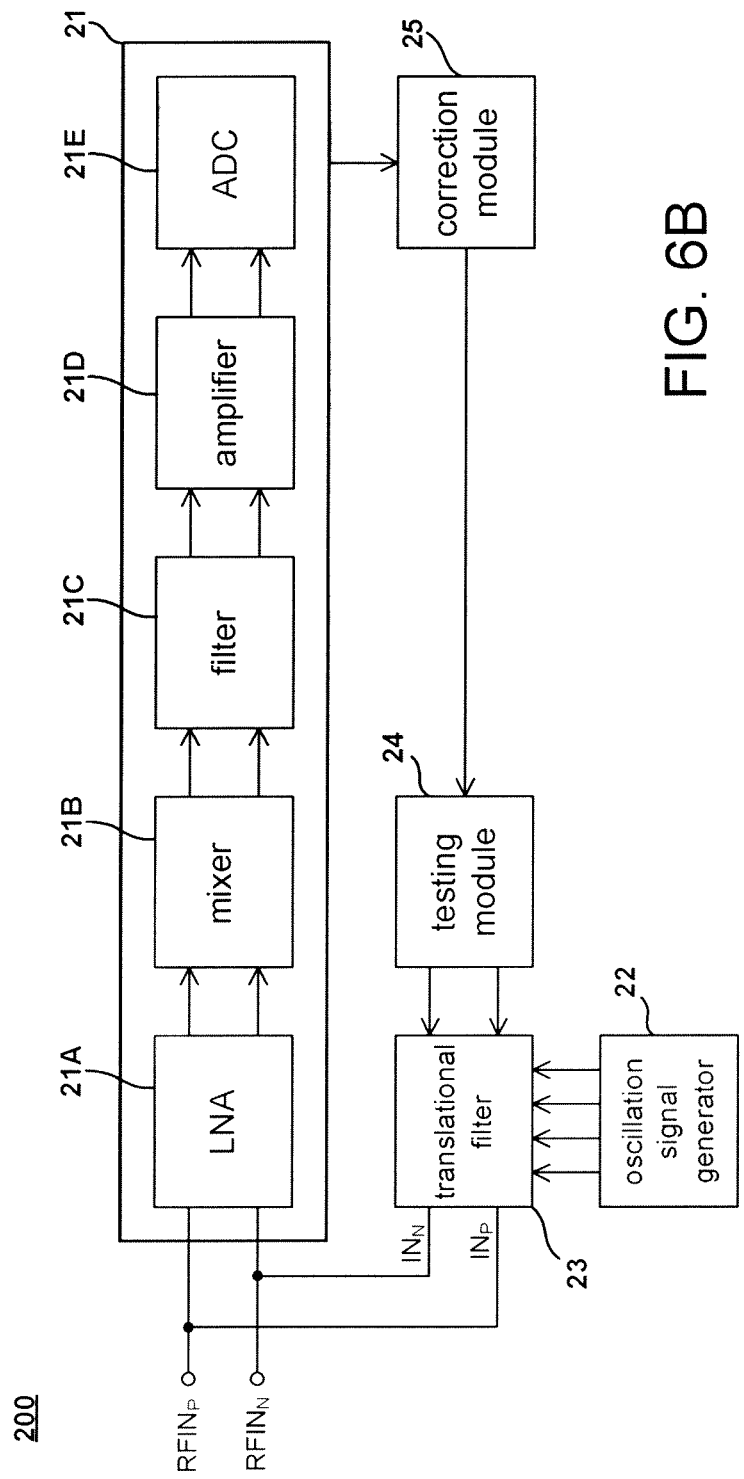

In another embodiment, as shown in FIG. 6(B), the correction setting generated by the correction module 25 is utilized to control the testing module 24. As previously described, in the testing mode, the correction module 25 determines a correction setting for the module under test 21. When the signal processing system 200 is later in the normal operation mode, the correction module 25 controls the testing module 24 to provide a set of non-converted correction signals to the low-frequency side of the mixer 23A according to the correction setting, so as to generate a set of correction signals at the high-frequency side of the mixer 23A. The set of correction signals and common externally inputted signals simultaneously enter the module under test 21. For example, the set of non-converted correction signals may include a DC signal, such that the set of correction signals forwarded into the module under test 21 may compensate the non-ideal factors in the module under test 21, e.g. eliminating the DC offset or carrier leakage. In practice, the correction signals that the translational filter 23 sends from the two nodes $IN_P$ and $IN_N$ may be different. According to actual requirements, the set correction signals may provide different correction amounts for the two differential paths. Details of the correction setting and designs of the correction signals are known to one skilled person in the art, and shall be omitted herein.

Figure 7:
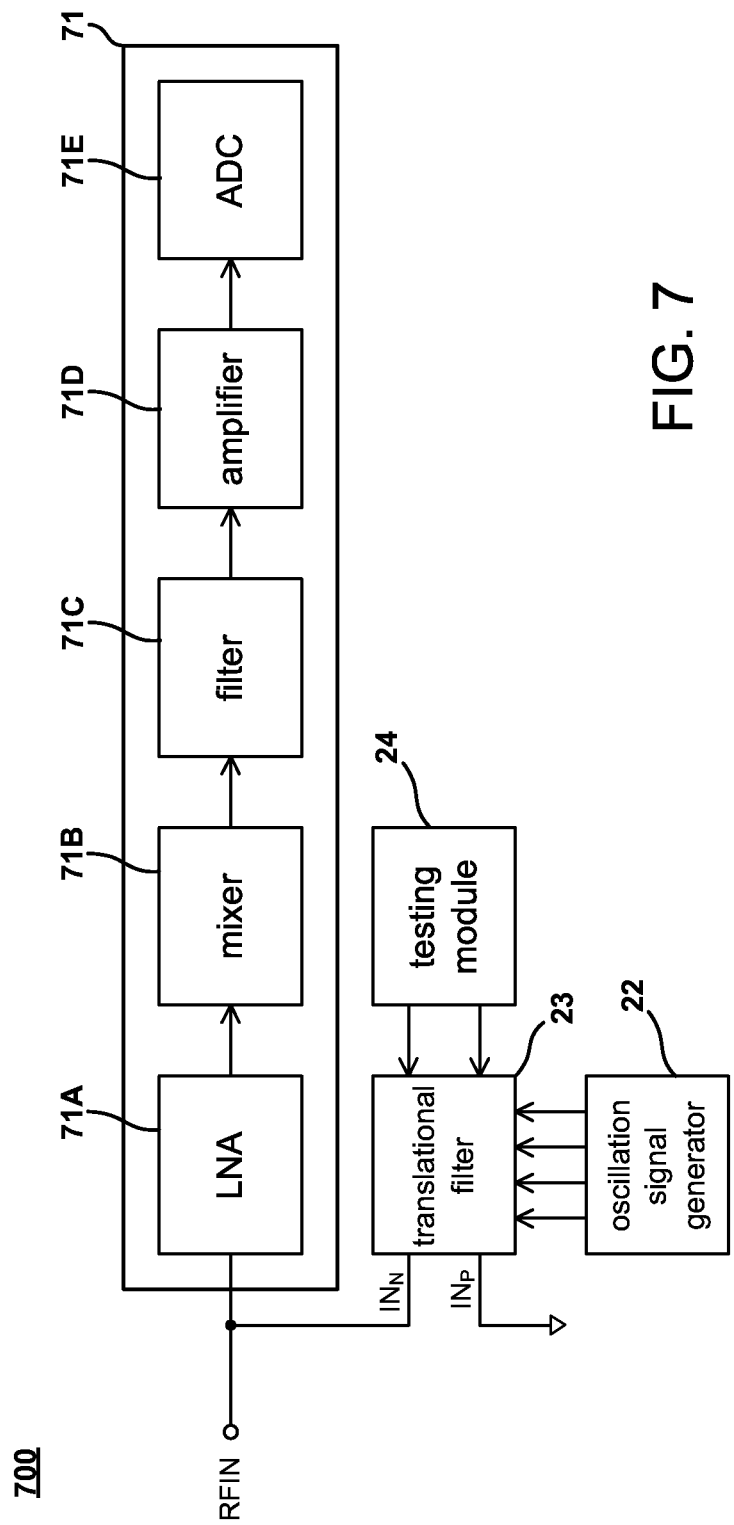
FIG. 7 is a schematic diagram of applying the concept of the present invention to a device under test that has one single input end.

As shown in FIG. 7, the concept of the present invention is also applicable to a single-ended input device under test. A module under test 71 in the signal processing system 700 is similar to the module under test 21. A main difference of the module under test 71 from the module under test 21 is that, a signal to be processed by an LNA 71A, a mixer 71B, a filter 71C, an amplifier 71D and an ADC 71E is a single-ended signal instead of differential signals. In the above situation, one of the two differential input ends $IN_P$ and $IN_N$ (the input end $IN_N$ in this example) of the translational filter 23 is connected to an input end RFIN of the LNA 71A, and the other input end (the input end $IN_P$ in this example) of the translational filter 23 is connected to ground. Similarly, the signal provided by the testing module 24 may be up-converted by the translational filter 23 and then transmitted to the module under test 71 to be utilized for testing or correction.

Figure 8:
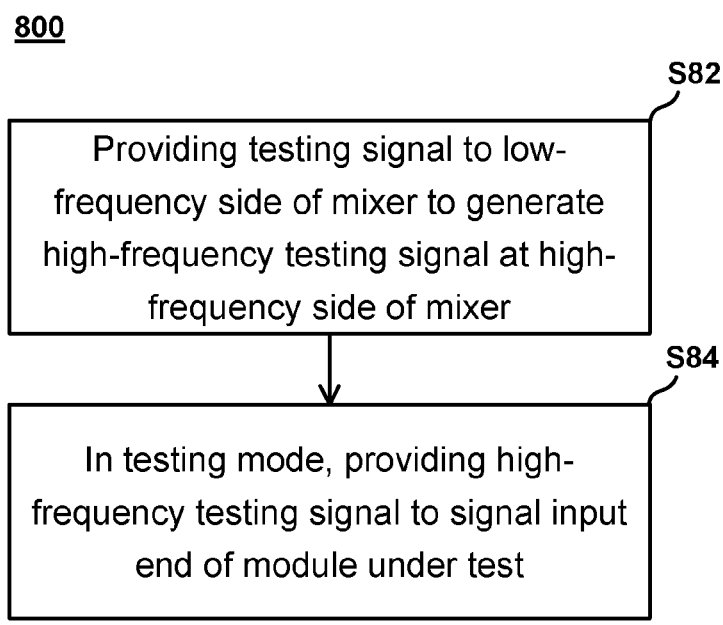
FIG. 8 is a flowchart of a correcting method according to an embodiment of the present invention.

According to another embodiment of the present invention, a testing method that generates a high-frequency testing signal by a translational filter is provided. FIG. 8 shows a flowchart of the testing method. The translational filter includes a mixer, which has a high-frequency side and a low-frequency side. In step S82, a testing signal is provided to the low-frequency side, so as to generate a high-frequency testing signal at the high-frequency side of the mixer. In step S84, in a testing mode, the high-frequency testing signal is provided to a signal input end of a module under test. In a normal operation mode relative to the testing mode, the translational filter provides the module under test with a filtering function.

Various operation details and modifications (e.g., performing correction after testing) in the description associated with the signal processing system 200 are applicable to the signal processing system 700 and the testing process 800, and shall be omitted herein.

In conclusion, a signal processing system with a BIST function and a testing method thereof are disclosed by the present invention. With a translational filter that generates a testing signal in a chip, overall testing costs can be significantly lowered. Further, in additional to a transmitting circuit included in a same signal processing system, the testing method of the present invention is also applicable to a signal processing system that does not include a transmitting circuit.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A signal processing system, comprising:
    a module under test, having a signal input end;
    an oscillation signal generator, configured to generate an oscillation signal;
    a translational filter, comprising a baseband filtering circuit and a mixer that is controlled by the oscillation signal, the mixer having a high-frequency side and a low-frequency side, the high-frequency side being coupled to the signal input end of the module under test, a low pass filter of the baseband filtering circuit being coupled to the low-frequency side; and
    a testing module, configured to provide a testing signal to the low-frequency side, so as to generate a high-frequency testing signal at the high-frequency side of the mixer,
    wherein the translation filter provides a bandpass filtering function controlled at least in part by the oscillation signal for the module under test in a normal operation mode and up-converts the test signal to generate a high-frequency testing signal at the high-frequency side of the mixer in a test mode.

2. The signal processing system according to claim 1, wherein an oscillation frequency of the oscillation signal is adjustable.

3. The signal processing system according to claim 1, wherein a frequency of the testing signal is adjustable.

4. The signal processing system according to claim 1, wherein the testing module provides the testing signal when the signal processing system is in a testing mode.

5. The signal processing system according to claim 4, wherein a connection between the baseband filtering circuit and the low-frequency side is disconnected when the signal processing system is in the testing mode.

6. The signal processing system according to claim 1, wherein the testing signal is a DC signal.

7. The signal processing system according to claim 1, wherein the testing module comprises a digital-to-analog converter (DAC) configured to output a low-frequency signal as the testing signal.

8. The signal processing system according to claim 1, further comprising:
    a correction module, configured to generate a correction setting according to a testing result that the module under test generates in response to the high-frequency testing signal.

9. The signal processing system according to claim 8, wherein the testing module provides a non-converted correction signal according to the correction setting to the low-frequency side when the signal processing system is in a normal operation mode, so as to generate a correction signal at the high-frequency side of the mixer.

10. The signal processing system according to claim 9, wherein the non-converted correction signal is a DC signal.

11. A testing method, that generates a high-frequency testing signal by a translational filter, the translational filter comprising a mixer having a high-frequency side and a low pass filter coupled to a low-frequency side, the testing method comprising:
    providing an oscillation signal for controlling the mixer;
    providing a testing signal to the low-frequency side, so as to generate a high-frequency testing signal at the high-frequency side of the mixer;
    in a testing mode, up-converting by the translational filter the testing signal to the high-frequency testing signal to a signal input end of a module under test; and
    in a normal operation mode, providing by the translational filter a bandpass filtering function controlled at least in part by the oscillation signal for the module under test.

12. The testing method according to claim 11, wherein the mixer is controlled by an oscillation signal, the testing method further comprising:
    adjusting an oscillation frequency of the oscillation signal.

13. The testing method according to claim 11, further comprising:
    adjusting an oscillation frequency of testing signal.

14. The testing method according to claim 11, wherein the testing signal is a DC signal.

15. The testing method according to claim 11, further comprising:
    determining a correction setting for the module under test according to a test result that the module under test generates in response to the high-frequency testing signal.

16. The testing method according to claim 15, further comprising:
    when the module under test is under the normal operation mode, providing a non-converted correction signal to the low-frequency side according to the correction setting, so as to generate a correction signal at the high-frequency side of the mixer.

17. A testing signal generator, configured to provide a high-frequency testing signal to a signal input end of a module under test, comprising:
    an oscillation signal generator, configured to generate an oscillation signal;
    a translational filter, comprising a baseband filtering circuit and a mixer that is controlled by the oscillation signal, the mixer having a high-frequency side and a low-frequency side, the high-frequency side being coupled to the signal input end of the module under test, a low pass filter of the baseband filtering circuit being coupled to the low-frequency side; and
    a testing module, configured to provide a testing signal to the low-frequency side, so as to generate a high-frequency testing signal at the high-frequency side of the mixer,
    wherein the translation filter provides a bandpass filtering function controlled at least in part by the oscillation signal for the module under test in a normal operation mode and up-converts the test signal to generate a high-frequency testing signal at the high-frequency side of the mixer in a test mode.

18. The testing signal generator according to claim 17, wherein the testing signal is a DC signal.

19. The testing signal generator according to claim 17, wherein the testing module comprises a DAC configured to output a low-frequency signal as the testing signal.

* * * * *